United States Patent [19]

Tsuchida et al.

[11] Patent Number: 5,641,840

[45] Date of Patent: Jun. 24, 1997

[54] EPOXY RESIN COMPOSITION FOR SEALING PHOTOSEMICONDUCTOR ELEMENT AND PHOTOSEMICONDUCTOR DEVICE SEALED WITH THE EPOXY RESIN COMPOSITION

[75] Inventors: Satoru Tsuchida, Sekijyo-machi; Masahiko Osaka; Kouzou Hirokawa, both of Shimodate; Yasuaki Nakamura, Oyama, all of Japan

[73] Assignee: Hitachi Chemical Company, Ltd., Tokyo, Japan

[21] Appl. No.: 649,014

[22] Filed: May 16, 1996

[30] Foreign Application Priority Data

May 16, 1995 [JP] Japan .................... 7-117032

[51] Int. Cl.$^6$ .................... C08G 59/14; C08L 63/00
[52] U.S. Cl. .................... 525/481; 525/484; 525/524; 528/98; 174/52.2; 257/793
[58] Field of Search ............... 174/52.2; 525/481, 525/484, 524; 528/98

[56] References Cited

U.S. PATENT DOCUMENTS

| | | | |
|---|---|---|---|
| 4,251,426 | 2/1981 | McClure et al. | 525/524 |
| 5,107,327 | 4/1992 | Nishimori et al. | 357/72 |

*Primary Examiner*—Frederick Krass
*Attorney, Agent, or Firm*—Antonelli, Terry, Stout & Kraus, LLP

[57] ABSTRACT

An epoxy resin composition for sealing a photosemiconductor element includes (A) an epoxy resin component which comprises an epoxy resin having at least three epoxy groups per molecule, (B) a phenolic resin component which is represented by the following general formula (I) and has a phenolic hydroxyl group equivalent weight (g/eq) of 200 to 800, and (C) a cure accelerator component,

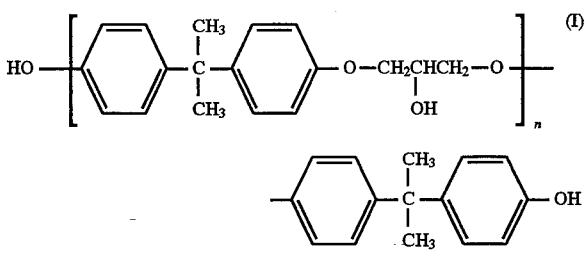

wherein n is an integer of from 0 to 14, the phenolic resin component being a mixture of at least two phenolic resins represented by the general formula (I) with at least two different values of n, the resin with n=0 being not more than 20% by weight of the phenolic resin component;

and a photosemiconductor device is sealed with the epoxy resin composition.

12 Claims, 2 Drawing Sheets

EPOXY RESIN COMPOSITION FOR SEALING PHOTOSEMICONDUCTOR ELEMENT AND PHOTOSEMICONDUCTOR DEVICE SEALED WITH THE EPOXY RESIN COMPOSITION

BACKGROUND OF THE INVENTION (a) Field of the Invention

The present invention relates to an epoxy resin composition for sealing photosemiconductor elements which is excellent in transparency and reliability and useful in sealing photosemiconductor devices, and to a photosemiconductor device sealed with the epoxy resin composition.

(b) Description of the Related Art

Photosemiconductor elements, such as light-emitting elements and photo receptors, have been sealed mainly with transparent epoxy resins containing acid anhydride hardeners and amine cure accelerators, because of the necessity for transparency.

The use of acid anhydrides as hardeners has required dampproofing with the greatest circumspection since acid anhydrides are easily hydrolyzed by water to cause deterioration in their properties. Also the cured products essentially have a shortcoming of poor moisture resistance due to the ester bonds made by the reaction of the acid anhydrides with epoxy resins. Further, the molded products are hardly satisfactory both in adhesion to metal and in thermal shock resistance.

To solve the above-described problems, it has been proposed to use specific phenol novolac resins as hardeners (Japanese Patent Application Unexamined Publication No. 6-184281). This proposal has shown that phenol novolac resins are less influenced by the presence of water than acid anhydrides, and the resulting cured products are somewhat improved in moisture resistance, thermal shock resistance and adhesion. As to transparency (light transmission factor) which is the most important property of the sealing materials for photosemiconductors, the cured products, however, are occasionally clouded due to the severe coloration of the phenol novolac resins by heat or due to their poor compatibility with epoxy resins, so that the cured products cannot satisfy the transparency standard required of packages of photosemiconductors and cannot receive practical application.

SUMMARY OF THE INVENTION

The object of the present invention is to provide an epoxy resin composition which contains a phenolic resin as a hardener and is excellent in transparency and reliability, and to provide a photosemiconductor device sealed with the cured product of the epoxy resin composition.

To solve the above-described problems, investigations were made in particular into the mechanism of the coloration of phenolic resins. It was consequently found that as the phenolic hydroxyl group concentration in a phenolic resin increases, the light transmissivity of the cured products decreases, and then advanced various studies were conducted on the basis of these facts.

It was found in accordance with the investigations that a cured product with excellent transparency can be obtained by using a phenolic resin which has two phenolic hydroxyl groups per molecule and which is represented by the following general formula (I),

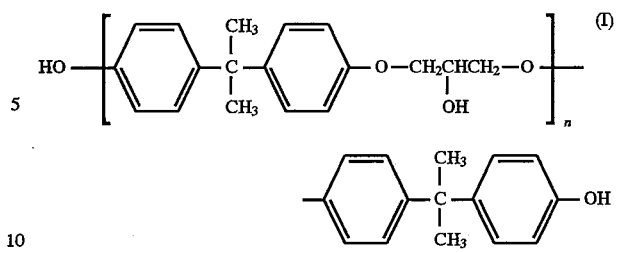

wherein n is an integer of from 0 to 14,
and we have consequently achieved the composition of the present invention.

That is, the present invention provides an epoxy resin composition comprising (A) an epoxy resin component which comprises an epoxy resin having at least three epoxy groups per molecule, (B) a phenolic resin component which is represented by the following general formula (I) and has a phenolic hydroxyl group equivalent weight (g/eq) of 200 to 800, and (C) a cure accelerator component,

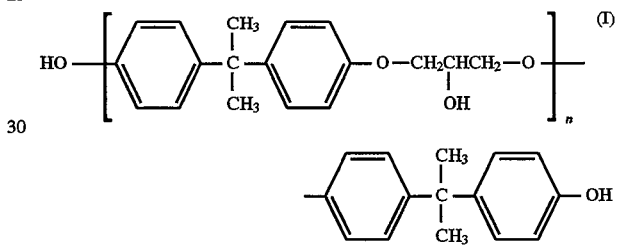

wherein n is an integer of from 0 to 14,
the phenolic resin component being a mixture of at least two phenolic resins represented by the general formula (I) with at least two different values of n, the resin with n=0 being not more than 20% by weight of the phenolic resin component (B).

THE PREFERRED EMBODIMENTS OF THE PRESENT INVENTION

Figure 1:
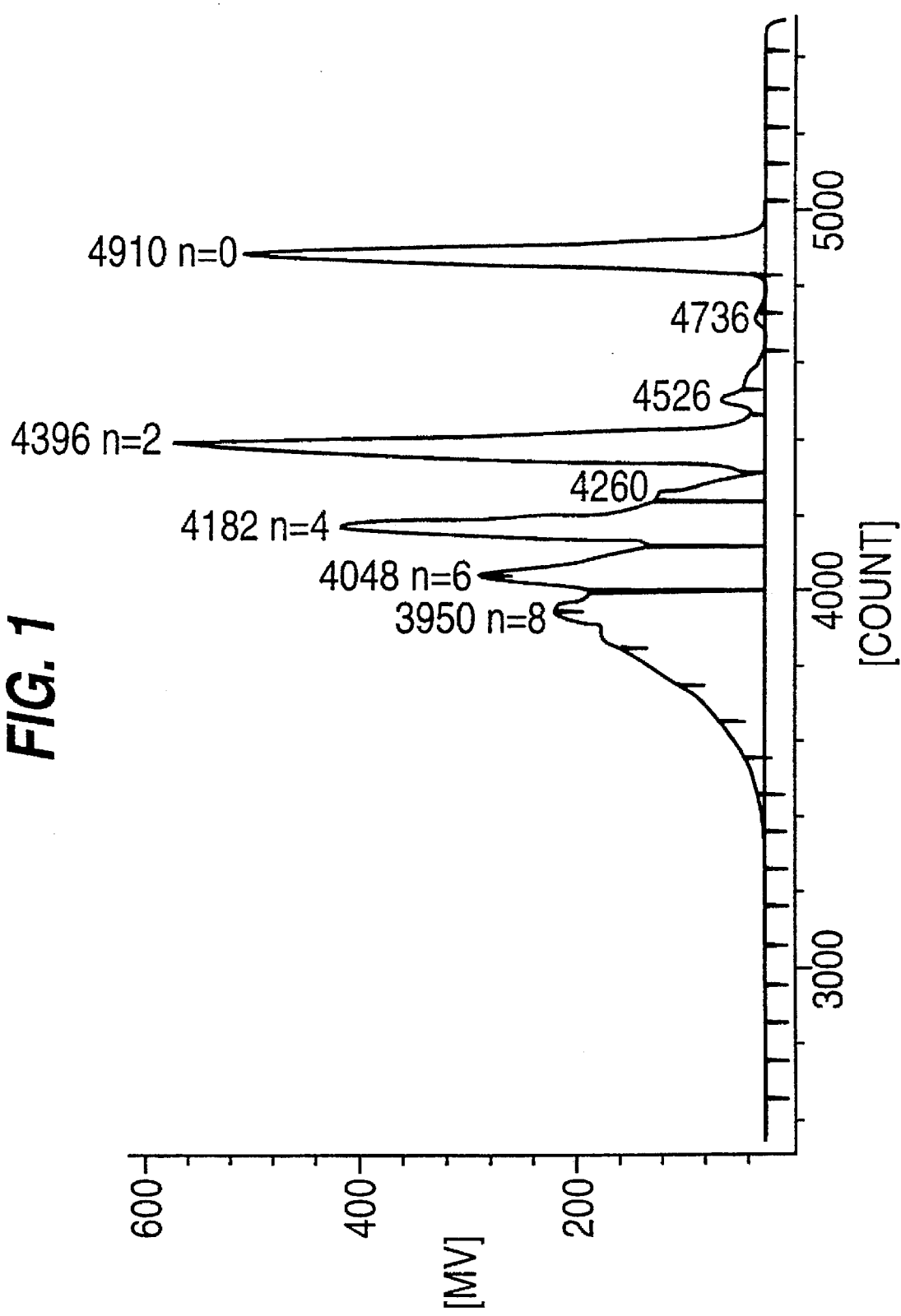
FIG. 1 is a chart showing a GPC spectrum of a hardener.

According to the present invention, it is essential for the epoxy resin component (A) to comprise the epoxy resin having at least three epoxy groups per molecule, namely an epoxy resin with trifunctionality or more. This requirement is because the composition of the present invention is destined to make three-dimensional crosslinking by the reaction of the epoxy resin having trifunctionality or more with the phenolic resins of the component (B) through ether bonds. The epoxy resin with trifunctionality or more preferably has a number average molecular weight (Gel Permeation Chromatography Method, polystyrene conversion) of 200 to 3000, more preferably 300 to 2000, and an epoxy equivalent weight of 50 to 500 (g/eq), more preferably 100 to 300 (g/eq). When the number average molecular weight is less than 200, voids tend to be formed in the molded products, and when the number average molecular weight is larger than 3000, the optical unevenness may arise. When the epoxy equivalent weight is less than 50, the mechanical strength of the molded products tends to reduced. When the epoxy equivalent weight is more than 500, the thermal resistance may be lost. The epoxy resin with trifunctionality or more may be selected from known epoxy resins and is not limitative so far as it is not or little colored. Some examples include phenol novolac epoxy resins, alicyclic epoxy resins and triglycidyl isocyanurate, which may be used individually or as a mixture. The epoxy resin component (A) may contain monofunctional epoxy resin having one epoxy group per molecule and/or difunctional epoxy resin having two epoxy groups per molecule in an amount up to 50% by weight. That is, the epoxy resin component (A) can comprise 0 to 50% by weight of a monofunctional epoxy resin and/or difunctional epoxy resin and 50 to 100% by weight of the epoxy resin with trifunctionality or more. If the epoxy resin with trifunctionality or more is less than 50% by weight, the crosslinking density of the cured product may be decreased to cause considerable deterioration in thermal resistance and solvent resistance.

The epoxy resins with difunctionality or less may be known epoxy resins and are not limitative so far as they are not or little colored, and some examples include bisphenol A epoxy resins, alicyclic epoxy resins, aliphatic epoxy resins and glycidyl ether epoxy resins, which may be used individually or as a mixture.

The difunctional phenolic resin to be used in the present invention as the component (B) may be prepared by heating and allowing a liquid bisphenol A epoxy resin and bisphenol A to react with each other, in the presence of a catalyst according to demands. According to this manner, a compound represented by the formula (I), wherein n is 0 or even-numbered integer, is generally obtained. The phenolic resin component (B) preferably has a number average molecular weight (Gel Permeation Chromatography Method, polystyrene conversion) of 500 to 3000 and a hydroxyl (phenolic hydroxyl) equivalent weight of 200 to 800 (g/eq). When the number average molecular weight is less than 500, the light transmission factor and curing property tend to be reduced, and when the number average molecular weight is more than 3000, the molding property tends to get worse and the optical unevenness may arise. A hydroxyl equivalent weight of less than the range means the increase of the resin with n=0 (i.e. bisphenol A), which may deteriorate the curability and transmissivity. According to the present invention, the n=0 resin is not more than 20% by weight, generally 1 to 20% by weight, based on the total phenolic resin component. The content of the resin with n=0 can be calculated from the area-% of GPC (gel permeation chromatography). On the other hand, a hydroxyl equivalent weight of more than the range may cause a sharp increase in viscosity, which induces deterioration in moldability to make the cured products optically irregular.

The amount of the phenolic resin component (B) is preferably 0.5 to 1.2 equivalents, more preferably 0.8 to 1.0 equivalent, per equivalent of the epoxy resin component (A). If the amount is less or more than the range, the properties of the cured products may be deteriorated due to an insufficient reaction.

Some examples of the cure accelerator component (C) to be used in the present invention include tertiary amines, imidazoles, DBU (1,8-diazabicyclo(5.4.0)undecene-7) and salts thereof, quaternary ammonium salts and quaternary phosphonium salts, and the amount of the cure accelerator component (C) is generally 0.05 to 10% by weight, preferably 0.1 to 5% by weight, based on the total of the epoxy resin component (A) and the phenolic resin component (B).

According to demands, the epoxy resin composition of the present invention may further contain known additives, such as release agents, antioxidants, colorants, coupling agents, modifiers, light (ultraviolet light, visible light, infrared light) absorbers, agents for decreasing stress and fillers.

It is preferable to use antioxidants, which effectively prohibit the epoxy resin composition from turning yellow.

The photosemiconductor device of the present invention is made by sealing, for example, encapsulating a photosemiconductor element with the epoxy resin composition of the present invention. The semiconductor elements which may be used in the present invention is not limited, and the preferred examples are light-emitting elements, such as GaAs-tips, GaP-tips and GaAlAs-tips, photo detectors, such as Si-tips, and photo complex devises, namely combinations of the light-emitting elements and the photo detectors. The light-emitting elements are used as light emitting diodes (LED), small light-emitting devices, etc. The photo detectors are used as photo sensors, such as CCD image sensors. The photo complex devices are used as photo couplers.

The manner of sealing (encapsulation) is not limited, and, for example, potting, casting, dipping or molding, particularly transfer molding, may be employed.

The pressure of the transfer molding is preferably 20–100 kgf/cm$^2$, more preferably 65–75 kgf/cm$^2$. The temperature of the transfer molding is preferably 140°–170° C., more preferably 150°–160° C. The time of the transfer molding is preferably 60 to 300 sec, more preferably 120–180 sec. The preferable conditions of aftercuring is 120°–170° C.×1–15 hours, more preferably 150°–160° C.×3–5 hours.

After molding, the epoxy resin composition of the present invention generally shows high transmission, for example, a light transmission factor of more than 80% under the condition that of using a sample of 2 mm thick and measuring transmission of a light between 500 to 1300 nm in wave length with a spectrophotometer. Thus, photosemiconductor devices sealed with the epoxy resin composition show the same high transmission as that of the molded epoxy resin composition.

The present invention will be described in more detail with reference to the following Examples, which, however, are not to be construed to limit the scope of the invention.

EXAMPLES 1 TO 3 AND COMPARATIVE EXAMPLES 1 TO 3

In the following Examples and Comparative Examples, various tests were carried out as follows.

(1) Light Transmission Factor

Samples of 2 mm thick were examined for the light transmission factor of a light of 589 nm in wave length with a spectrophotometer (U-2000, produced by Hitachi, Ltd.).

(2) Glass Transition Temperature

Samples of 2 mm in diameter and 20 mm in thickness were heated at a rate of 5° C./min and examined by using TMA (TMA-8140, produced by Rigaku Kabushiki Kaisha) for the temperatures at which the elongation of the samples changed sharply.

(3) Aluminum Peel Strength

Mirror finished aluminum foil was laid on the bottom of a mold, and each sealing material was molded on the mirror surface of the aluminum foil. By using an autograph (AGS-500A, produced by Kabushiki Kaisha Shimazu Seisakusho), each molded product was examined for the peel strength of the aluminum foil by perpendicularly peeling the aluminum foil at a rate of 30 mm/min.

(4) Red·Ink·Check

A QFP frame molded with each sealing material (material: 42 alloy, tab surface: Ag-plated, external sizes: 19.7×13.7×2.7 mm) was dipped for 30 seconds in a solder bath heated to 260° C. and was then dipped for 72 hours in a red ink in a pressure vessel at a pressure of 3 kgf/cm² and at room temperature. Then the penetration of the ink was observed.

The results are exhibited as follows.

o... No penetration of the ink

Δ... A little penetration of the ink

X... Considerable penetration of the ink (5) Moisture Resistance

Aluminum wired sample photosemiconductor elements were resin-molded to form packages (pin numbers: 16, aluminum wiring: MOS15033, package sizes: 20×6.3×2.3 mm). After the packages were allowed to stand at 85° C. and at 85% for 1000 hours, the percentages of broken aluminum wires were calculated and the highest moisture resistance was given as 0%.

The materials as listed in Table 1 were mixed, and each mixture was kneaded in a kneader (barrel temperature: 70° C.) and was then cooled and ground, to give a powdery epoxy resin composition. By using each of the molds for the above-described tests, each epoxy resin composition was transfer molded at a molding temperature of 150° C. (molding time: 3 minutes) and at a molding pressure of 70 kgf/cm², and was then after cured at 150° C. for four hours. The properties of the resulting molded products are listed in Table 1.

Figure 2:
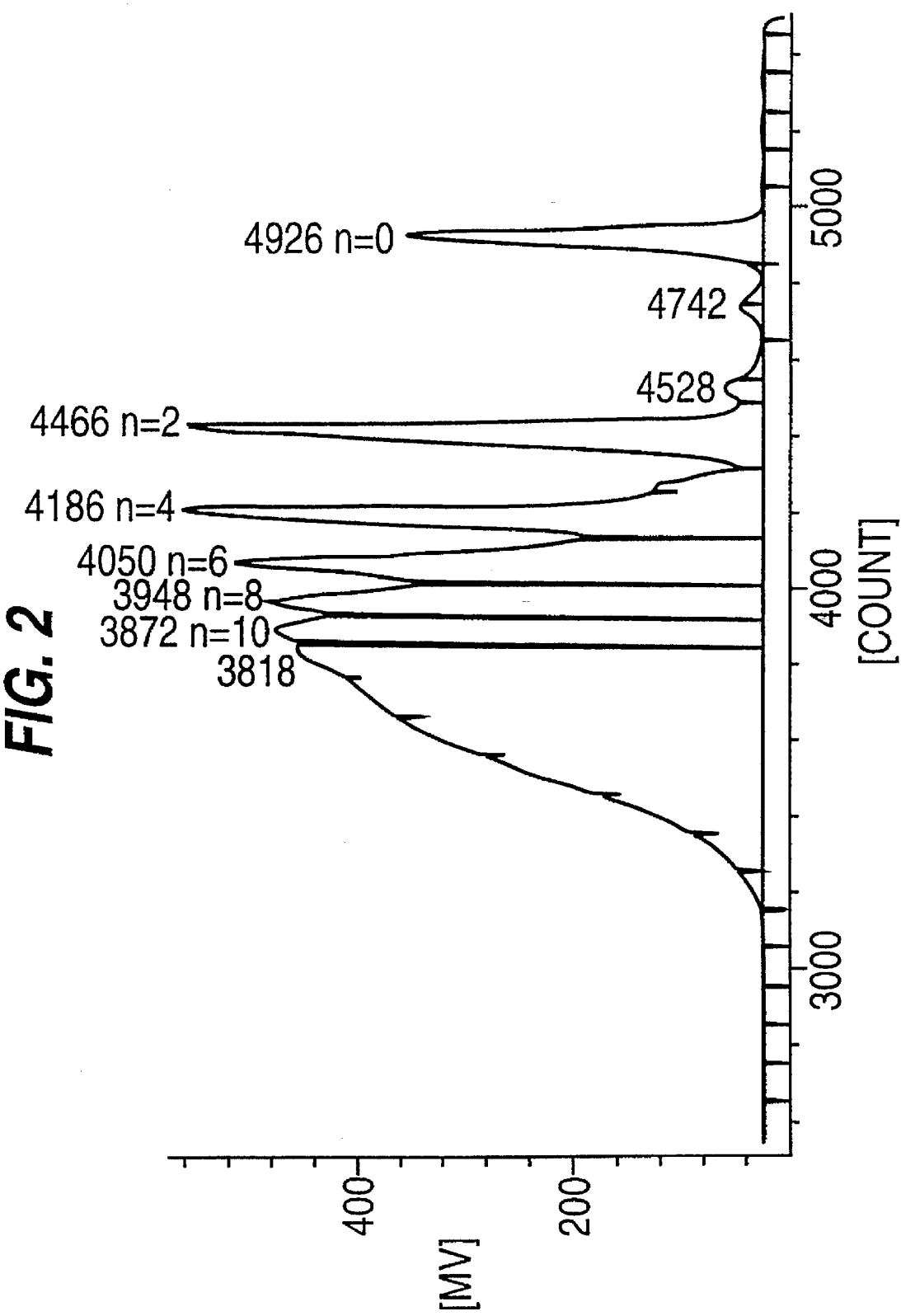
FIG. 2 is a chart showing a GPC spectrum of another hardener.

FIG. 1 shows a GPC (gel permeation chromatography) spectrum of the hardener*7 used in Examples 1, 2 and 3, and FIG. 2 shows a GPC spectrum of the hardener*8 used in Example 3. The vertical line shows the strength of each peak indicated by the means the voltage (mV), which means the amount of each ingredient of the phenolic resin component represented by the formula (I). The horizontal line shows time, and one count means 0.5 sec.

Each following peak in FIG. 1 means the ingredient of the following n of the formula (I): 4910: n=0, 4396: n=2, 4182: n=4, 4048: n=6, 3950: n=8.

Each following peak in FIG. 2 means the ingredient of the following n of the formula (I): 4916: n=0, 4466: n=2, 4186: n=4, 4050: n=6, 3948: n=8, 3872: n=10.

The measurements of the GPC spectra were carried out under the following conditions:

Measuring apparatus: HLC-802A (trade name) produced by Toso Kabushiki Kaisha

Column: TSK-GEL G2000 H8 (60 cm), TSK-GEL G3000 H8 (60 cm), TSK-GEL G4000 H8 (60 cm)

Guard column: TSK GUARD COLUMN H8 (7.5 cm)

Number of theoretical plates: N=55,000

Solvent: THF 1.2 ml/min

Sample: 1% solution 200 μl polystyrene conversion

TABLE 1

| | Examples | | | Comparative Examples | | |
|---|---|---|---|---|---|---|
| | 1 | 2 | 3 | 1 | 2 | 3 |
| Epoxy resin component | | | | | | |
| R367 *1 | 40 | 20 | 0 | 40 | 40 | 80 |
| EPPN-201 *2 | 60 | 0 | 100 | 60 | 60 | 0 |
| TEPIC *3 | 0 | 80 | 0 | 0 | 0 | 20 |

TABLE 1-continued

| | Examples | | | Comparative Examples | | |
|---|---|---|---|---|---|---|
| | 1 | 2 | 3 | 1 | 2 | 3 |
| Hardener | | | | | | |
| *7 General formula (I) Phenolic hydroxyl equivalent weight: 377 n = 0 resin 15 wt % | 120 | 280 | 145 | 0 | 0 | 0 |
| *8 General formula (I) Phenolic hydroxyl equivalent weight: 697 n = 0 resin 5 wt % | 0 | 0 | 65 | 0 | 0 | 0 |
| THPA *4 | 0 | 0 | 0 | 0 | 45 | 36 |
| HP-850N *5 | 0 | 0 | 0 | 35 | 0 | 0 |
| Cure accelerator C11Z *6 | 1.8 | 1.8 | 1.8 | 1.8 | 1.8 | 1.8 |
| Light transmission factor (%) | 89 | 89 | 89 | 61 | 81 | 89 |
| Glass transition temperature (°C.) | 120 | 120 | 125 | 145 | 139 | 120 |
| Aluminum peel strength (g/cm) | 680 | 650 | 660 | 440 | 280 | 300 |
| Red.ink.check | o | o | o | Δ | x | x |
| Moisture resistance (%) | 0 | 0 | 0 | 40 | 90 | 95 |

*1 difunctional bisphenol A epoxy resin produced by Mitsui Petrochemical Industries, Ltd. (number average molecular weight: 2500, epoxy equivalent weight: 1250)
*2 pentafunctional phenolic novolac epoxy resin produced by Nippon Kayaku Kabushiki Kaisha (number average molecular weight: 950, epoxy equivalent weight: 192)
*3 trifunctional triglycidyl isocyanurate epoxy resin produced by Nissan Chemical Industries Co., Ltd. (number average molecular weight: 300, epoxy equivalent weight: 100)
*4 tetrahydrophthalic anhydride (RIKACID TH) produced by Shin-Nippon Rika Kabushiki kaisha (acid anhydride equivalent weight: 152)
*5 phenol novolac resin produced by Hitachi Chemical Company, Ltd. (phenolic hydroxyl equivalent weight: 106)
*6 imidazole (CUREZOL C11Z) produced by Shikoku Chemicals Corp.
*7 phenolic resin (ZX-767, produced by Tohto Kasei Kabushiki Kaisha, number average molecular weight: 1054)
*8 phenolic resin (ZX-798, produced by Tohto Kasei Kabushiki Kaisha, number average molecular weight: 1931)

The results show that the use of an acid anhydride as a hardener (Comparative Examples 2 and 3) gave cured products which had high light transmission factors but were poor in adhesion to metal and in moisture resistance. The use of a phenol novolac resin as a hardener (Comparative Example 1) gave a cured product which was improved but yet insufficient in adhesion to metal and in moisture resistance and had a considerably decreased light transmission factor. To the contrary, the epoxy resin compositions according to the present invention were so excellent in light transmission factors, adhesion to metal and thermal resistance, and further in moisture resistance.

Photosemiconductor devices were produced by sealing, i.e. encapsulating photosemiconductor elements (infrared emitting-diodes: tip type: Model No. GL420 (trade name) produced by Sharp Corp., package sizes: 4.0×4.0×1.6$'_{mm}$) with the epoxy resin compositions prepared in the Examples. The encapsulation was carried out by transfer molding the infrared emitting-elements at a molding pressure of 70 kgf/cm², at a molding temperature of 150° C. for 3 minutes, and then conducting after cure at 150° C. for 4 hours. The resulting photosemiconductor devices had high reliability and showed excellent high transmission and moisture resistance.

As described above, the present invention has enabled the production of photosemiconductor devices which are excellent in transparency and thermal resistance and also in adhesion to metal and moisture resistance.

What is claimed is:

1. An epoxy resin composition for sealing a photosemiconductor element comprising
   (A) an epoxy resin component which comprises an epoxy resin having at least three epoxy groups per molecule,
   (B) a phenolic resin component which is represented by the following general formula (I) and has a phenolic hydroxyl group equivalent weight (g/eq) of 200 to 800, and
   (C) a cure accelerator component,

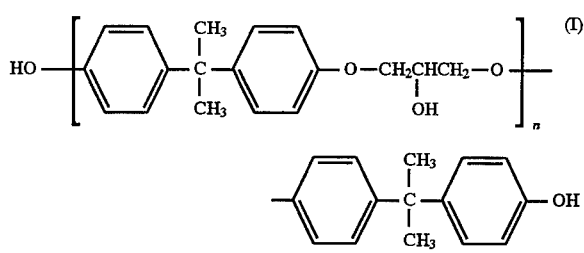

wherein n is an integer of from 0 to 14,
the phenolic resin component being a mixture of at least two phenolic resins represented by the general formula (I) with at least two different values of n, a resin with n=0 being not more than 20% by weight of the phenolic resin component.

2. An epoxy resin composition according to claim 1, wherein the epoxy resin component (A) comprises 50 to 100% by weight of the epoxy resin having at least three epoxy groups per molecule and 0 to 50% by weight of an epoxy compound having one epoxy group per molecule or an epoxy resin having two epoxy groups per molecule, all based on the total of the epoxy resin component (A).

3. An epoxy resin composition according to claim 1, wherein the cure accelerator component (C) is selected from the group consisting of a tertiary amine, a quaternary amine, an imidazole, DBU or a salt thereof, a quaternary ammonium salt and a quaternary phosphonium salt.

4. An epoxy resin composition according to claim 1, wherein the phenolic resin component (B) is present at 0.5 to 1.2 equivalents per equivalent of the epoxy resin component (A), and the cure accelerator component (C) is present at 0.05 to 10% by weight based on the total weight of the epoxy resin component (A) and the phenolic resin component (B).

5. An epoxy resin composition according to claim 1, wherein the epoxy resin having at least three epoxy groups per molecule is selected from the group consisting of a phenol novolac epoxy resin, an alicyclic epoxy resin and a triglycidyl isocyanurate.

6. An epoxy resin composition according to claim 1, wherein the light transmission factor after molding is more than 80% under a condition of using a sample that is 2 mm thick and of measuring transmission of a light having a wave length between 500–1300 nm with a spectrophotometer.

7. A process for sealing a photosemiconductor element, comprising encapsulating the element with the epoxy resin composition of claim 1 as a sealing material.

8. A process for producing a semiconductor device, comprising a step of sealing a photosemiconductor element with the epoxy resin composition of claim 1.

9. A process for producing a semiconductor device according to claim 8, wherein sealing is effected by transfer molding.

10. A photosemiconductor device sealed with the epoxy resin composition of claim 1.

11. A photosemiconductor device according to claim 10, which comprises a light-emitting element or a photo detector.

12. A photosemiconductor according to claim 10, wherein the light transmission factor of a sealed device is more than 80% under a condition of using a sample that is 2 mm thick and of measuring transmission of a light having a wave length between 500–1300 nm with a spectrophotometer.

* * * * *